United States Patent
Chou et al.

(10) Patent No.: US 9,530,798 B1
(45) Date of Patent: Dec. 27, 2016

(54) HIGH PERFORMANCE HEAT SHIELDS WITH REDUCED CAPACITANCE

(71) Applicant: GLOBALFOUNDRIES INC., Grand Cayman, KY (US)

(72) Inventors: Anthony I. Chou, Beacon, NY (US); Sungjae Lee, Burlington, VT (US); Joseph M. Lukaitis, Pleasant Valley, NY (US); Robert R. Robison, Colchester, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/748,355

(22) Filed: Jun. 24, 2015

(51) Int. Cl.
| | |
|---|---|
| *H01L 23/552* | (2006.01) |
| *H01L 23/66* | (2006.01) |
| *H01L 27/12* | (2006.01) |
| *H01L 23/522* | (2006.01) |
| *H01L 23/373* | (2006.01) |
| *H01L 21/22* | (2006.01) |
| *H01L 21/3205* | (2006.01) |

(52) U.S. Cl.
CPC .......... *H01L 27/1207* (2013.01); *H01L 21/22* (2013.01); *H01L 21/32053* (2013.01); *H01L 23/3736* (2013.01); *H01L 23/5222* (2013.01); *H01L 23/5226* (2013.01)

(58) Field of Classification Search
CPC ...... H01L 23/38; H01L 23/522; H01L 23/532; H01L 35/30; H01L 35/34; H01L 29/66; H01L 23/367; H01L 23/5225; H01L 23/3677; H01L 23/5228; H01L 2924/3025; H01L 2924/3011; H01L 2924/14

USPC ........ 257/503, 499, 508, 659, 660, 662, 664
See application file for complete search history.

(56) References Cited

U.S. PATENT DOCUMENTS

| | | | |
|---|---|---|---|
| 6,121,661 | A | 9/2000 | Assaderaghi et al. |
| 6,190,985 | B1 | 2/2001 | Buynoski |
| 6,515,333 | B1 | 2/2003 | Riccobene |
| 6,573,565 | B2 | 6/2003 | Clevenger et al. |
| 6,597,065 | B1 | 7/2003 | Efland |
| 7,651,897 | B2 | 1/2010 | Vashchenko et al. |
| 8,237,228 | B2 | 8/2012 | Or-Bach et al. |
| 8,436,248 | B2 | 5/2013 | Chernyakov et al. |
| 8,450,804 | B2 | 5/2013 | Sekar et al. |
| 8,470,682 | B2 | 6/2013 | Anderson et al. |
| 2002/0160574 | A1* | 10/2002 | Zahurak .................. H01L 21/84 438/283 |
| 2015/0115431 | A1* | 4/2015 | Chadwick ............... H01L 23/38 257/712 |

* cited by examiner

*Primary Examiner* — Chuong A Luu
(74) *Attorney, Agent, or Firm* — Thompson Hine LLP; Anthony Canale

(57) ABSTRACT

Methods and structures for capacitively isolating a heat shield from a handle wafer of a silicon-on-insulator substrate. A contact plug is located in a trench extending through a trench isolation region in a device layer of the silicon-on-insulator substrate and at least partially through a buried insulator layer of the silicon-on-insulator substrate. The heat shield is located in an interconnect structure, which also includes a wire coupling the heat shield with the contact plug. An isolation structure is positioned between the contact plug and a portion of the handle wafer. The isolation structure provides the capacitive isolation.

15 Claims, 4 Drawing Sheets

HIGH PERFORMANCE HEAT SHIELDS WITH REDUCED CAPACITANCE

BACKGROUND

The invention relates generally to semiconductor devices and integrated circuit fabrication and, in particular, to device structures and fabrication methods for implementing a high performance heat shield.

Integrated circuit fabrication includes front-end-of-line (FEOL) processing, middle-of-line (MOL) processing, and back-end-of-line (BEOL) processing that are coordinated to produce chips. After active devices are formed by FEOL processing, MOL and BEOL processing are used to form an interconnect structure that includes metal lines and conductor-filled vias defining a three-dimensional framework of conductive paths. The conductive paths interconnect devices of the chip to power such devices and enable such devices to share and exchange information.

Metal lines in the interconnect structure have a small feature size and are subjected to high direct current densities during operation. These metal lines are highly susceptible to the occurrence of current-driven electromigration, which causes migration of metal atoms in the direction of electron flow due to momentum transfer between conducting electrons and diffusing metal atoms. Electromigration may operate to redistribute the metal. The metal redistribution may prompt failures from voids formed in the metal lines and failures from extrusions of metal from the metal lines into the surrounding dielectric material. As a result of these slightly different failure modes, voids may result in an open circuit and extrusions can cause a short circuit between adjacent metal lines.

Improved device structures and fabrication methods are needed for implementing a high performance heat shield.

SUMMARY

In an embodiment of the invention, a method is provided for processing a silicon-on-insulator substrate. The silicon-on-insulator substrate includes a device layer, a buried insulator layer, and a handle wafer. The method includes forming a trench extending through a trench isolation region in the device layer and at least partially through the buried insulator layer. The method further includes forming an isolation structure between the trench and a portion of the handle wafer. A contact plug is formed in the trench, and an interconnect structure is formed that includes a heat shield and a wire coupling the heat shield with the contact plug. The isolation structure capacitively isolates the heat shield from the handle wafer.

In an embodiment of the invention, a structure is formed using a silicon-on-insulator substrate. The silicon-on-insulator substrate includes a device layer, a buried insulator layer, and a handle wafer. The structure includes a trench isolation region in the device layer, a contact plug in a trench extending through the trench isolation region and at least partially through the buried insulator layer, and an interconnect structure including a heat shield and a first wire coupling the heat shield with the contact plug. An isolation structure is positioned between the contact plug and a portion of the handle wafer. The isolation structure capacitively isolates the heat shield from the handle wafer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
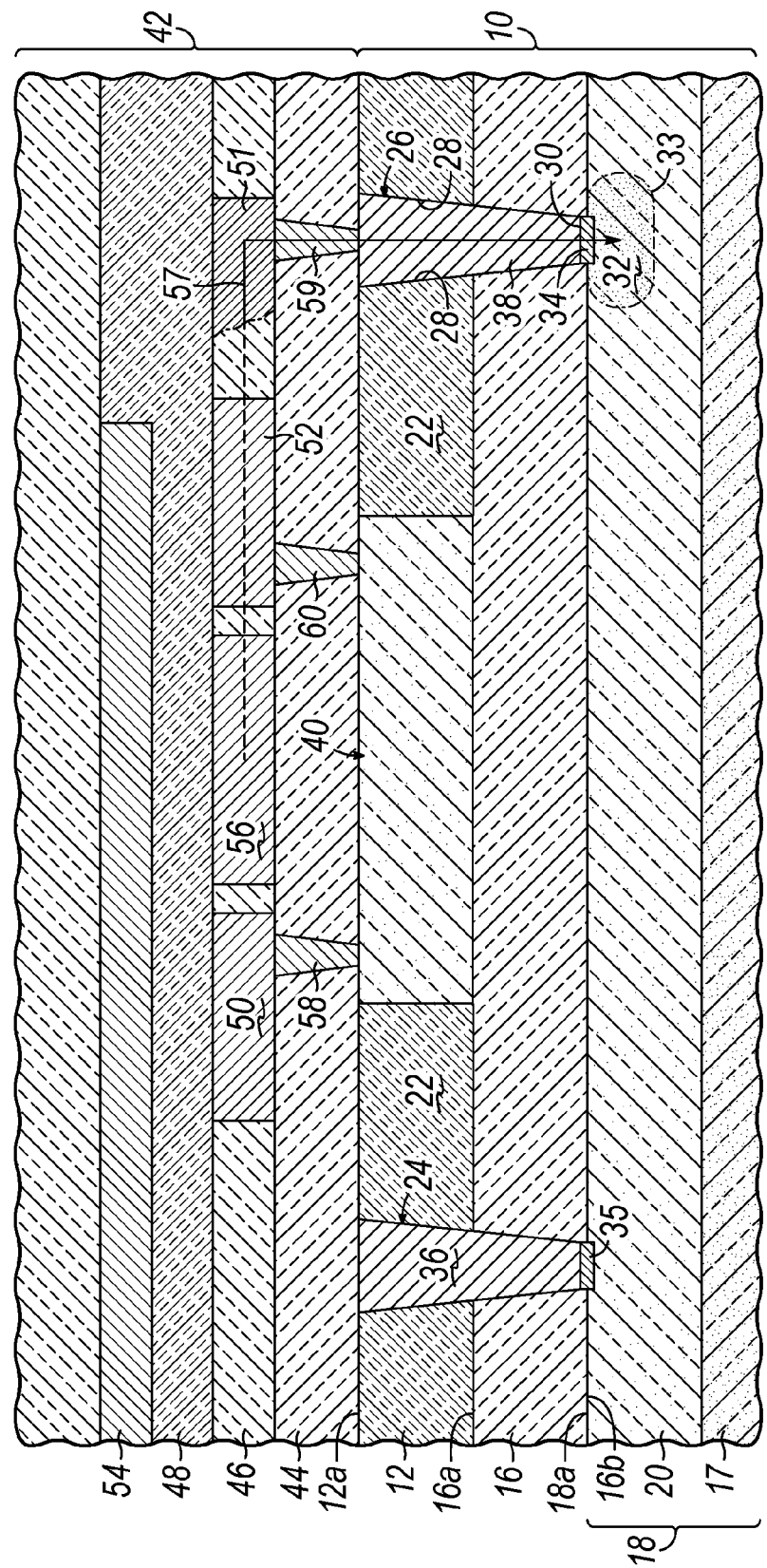
FIG. 1 is a cross-sectional view of a portion of a substrate including a device structure in accordance with an embodiment of the invention.

With reference to FIG. 1 and in accordance with an embodiment of the invention, a semiconductor-on-insulator (SOI) substrate 10 may include a device layer 12, a buried insulator layer 16, and a handle wafer 18. The device layer 12 is separated from the handle wafer 18 by the intervening buried insulator layer 16 and is considerably thinner than the handle wafer 18. The device layer 12 is in direct contact with a top surface 16a of the buried insulator layer 16 across a planar interface, and the buried insulator layer 16 includes a bottom surface 16b in direct contact with the handle wafer 18 across another planar interface. The buried insulator layer 16 may be comprised of an electrical insulator and, in particular, may be a buried oxide layer comprised of silicon dioxide ($SiO_2$). The handle wafer 18 may comprise an epitaxial layer 20 adjacent to the buried insulator layer 16. The semiconductor material of the epitaxial layer 20 may have an opposite conductivity type from a bulk wafer 17 of the handle wafer 18.

Trench isolation regions 22 in the device layer 12 of the SOI substrate 10 define a device region from a surrounding portion of the device layer 12. The trench isolation regions 22 may be formed by depositing a hardmask, patterning the hardmask and device layer 12 with lithography and etching processes to define trenches in the constituent semiconductor material of the device layer 12, depositing an electrical insulator to fill the trenches, planarizing the electrical insulator relative to the hardmask using a chemical mechanical polishing (CMP) process, and removing the hardmask. In one embodiment, the trench isolation regions 22 may be comprised of silicon dioxide deposited by low pressure chemical vapor phase deposition (LPCVD), and may penetrate completely through the device layer 12 to the top surface 16a of the buried insulator layer 16.

Trenches 24, 26 extend from a top surface 12a of the device layer 12 through the device layer 12, past the top surface 16a of the buried insulator layer 16, and through the buried insulator layer 16 to the top surface 18a of the handle wafer 18. The trench 26 has sidewalls 28 and a bottom surface 30 extending between the sidewalls 28. The bottom surface 28 of trench 26 may be coextensive with the top surface 18a of the handle wafer 18. To form the trenches 24, 26, a mask layer may be applied on a top surface 12a of the device layer 12 and patterned with photolithography. Specifically, openings are defined in the mask layer at the intended location of the trenches 24, 26 to be subsequently formed. To that end, the mask layer may comprise a light-sensitive material, such as a photoresist, that is applied by a spin coating process, pre-baked, exposed to light projected through a photomask, baked after exposure, and developed with a chemical developer to form an etch mask. An etching process is used, with the mask layer present on the top surface 12a of the device layer 12, to form the trenches 24, 26 at the locations of the openings. The etching process may be conducted in a single etching step or multiple steps, and may rely on one or more etch chemistries. The mask layer may be removed after the trenches 24, 26 are formed by the etching process. If comprised of a photoresist, the mask layer may be removed by ashing or solvent stripping, followed by a conventional cleaning process.

Another mask layer may be applied on a top surface 12a of the device layer 12 and patterned with photolithography to define an opening that is registered with the trench 26 and that covers and/or occupies the trench 24. To that end, the mask layer may comprise a light-sensitive material, such as a photoresist, that is applied by a spin coating process, pre-baked, exposed to light projected through a photomask, baked after exposure, and developed with a chemical developer to form an implantation mask. The implantation mask represents the only additional mask required in the process flow to form the isolation structure that provides capacitance improvement.

A doped region 32 is located in a section of the handle wafer 18 at the bottom surface 30 of the trench 26. The doped region 32 may be formed at a shallow depth beneath the top surface 18a of the handle wafer 18 by introducing a dopant into the semiconductor material of the handle wafer 18 with the implantation mask present. In one embodiment in which the epitaxial layer 20 of the handle wafer 18 is characterized by n-type conductivity, the doped region 32 may be formed by implanting ions comprising a p-type dopant from Group III of the Periodic Table (e.g., boron) with implantation conditions (e.g., kinetic energy and dose) effective to place the dopant in a given concentration across a shallow depth in the epitaxial layer 20 of the handle wafer 18 relative to the bottom surface 30 of the trench 26 and the top surface 18a of the handle wafer 18. The projected range and range straggle are controlled using the implantation parameters (e.g., ion kinetic energy) so that a portion of the epitaxial layer 20 is vertically positioned between the doped region 32 and the interface between the epitaxial layer 20 and the bulk wafer 17. In an embodiment in which the epitaxial layer 20 of the handle wafer 18 is characterized by p-type conductivity, the doped region 32 may be formed by implanting ions comprising an n-type dopant (e.g., phosphorus (P), arsenic (As), or antimony (Sb)) in a similar manner. The mask layer blocks the implanted ions from reaching the device layer 12 or the handle wafer 18 at the bottom surface of the trench 24. In one embodiment, the doped region 32 may be comprised of heavily-doped semiconductor material having an n-type conductivity and the epitaxial layer 20 may be comprised of heavily-doped semiconductor material having a p-type conductivity.

Following ion implantation to create the doped region 32, the mask layer may be removed. If comprised of a photoresist, the mask layer may be removed by ashing or solvent stripping, followed by a conventional cleaning process.

A silicide layer 34 is located at the bottom surface 30 of the trench 26, and a silicide layer 35 is also located at the bottom surface of trench 24. The silicide layers 34, 35 may be formed by a silicidation process that involves one or more annealing steps to form a silicide phase by reacting a layer of silicide-forming metal and the semiconductor material of the handle wafer 18 contacting the silicide-forming metal. The layer of a silicide-forming metal is deposited by, for example, a thermal chemical vapor deposition (CVD) process or a physical vapor deposition (PVD) process. Candidate transition metals for the silicide-forming metal include, but are not limited to, titanium (Ti), cobalt (Co), or nickel (Ni).

Contact plugs 36, 38 are respectfully located in the trenches 24, 26 and may be comprised of a semiconductor material that conforms in shape to the shape of the trenches 24, 26. The contact plugs 36, 38 extend from one end adjacent to the top surface 12a of the device layer 12 to an opposite end that is proximate to, or coextensive with, the top surface 18a of the handle wafer 18. In a representative embodiment, the semiconductor material comprising the contact plugs 36, 38 may be polysilicon (i.e. polycrystalline silicon) deposited by chemical vapor deposition, and may contain either an n-type dopant or a p-type dopant in a concentration effective to enhance its electrical conductivity and to either impart either n-type or p-type conductivity to the polysilicon.

Front-end-of-line (FEOL) processing is used to fabricate device structures of one or more integrated circuits using the semiconductor material of the device layer 12 and/or built on the buried insulator layer 16. A representative device structure 40, which is fabricated using the device region of the device layer 12 surrounded by the trench isolation regions 22, may be a resistor. In an alternative embodiment, the device structure 40 may be a different type of passive device that operates as a heat source when powered. In an alternative embodiment, the device structure 40 may be an active device, such as a bipolar junction transistor or a field effect transistor that operates as a heat source when powered.

Middle-of-line (MOL) and back-end-of-line (BEOL) processing follows FEOL processing to form an interconnect structure 42 on the device layer 12 of the SOI substrate 10. The interconnect structure 42 may include a plurality of dielectric layers 44, 46, 48 that are vertically arranged in a stack of metallization levels. Lines or wires 50, 52 and a heat shield 56 are embedded as conductive features in trenches or troughs primarily defined in dielectric layer 46. A line or wire 54 is embedded as a conductive feature in a trench or trough defined in dielectric layer 48. The wires 50, 52 are respectively coupled by via plugs 58, 60 in dielectric layer 44 with the device structure 40. The heat shield 56 is coupled by another line or wire 51 in dielectric layer 46 and a via plug 59 in dielectric layer 44 with the contact plug 38. The heat shield 56 may be formed, for example, as a mesh structure comprised of a grid of intersecting metal lines. The heat shield 56 is separated by a portion of the dielectric layer 44 from the device region in the device layer 12, which results in a parasitic capacitance under chip operating conditions in which the device structure 40 and wires 50, 52, 54 are powered and carrying electrical currents.

The interconnect structure 42 may include additional metallization levels each comprised of wiring and/or conductor-filled vias embedded in one or more dielectric layer. The wiring of the different metallization levels may exhibit hierarchical scaling factors for pitch and cross-sectional dimensions of the constituent wiring. Each of these metallization levels of the interconnect structure 42 may be individually formed by lithography, etching, deposition, and polishing techniques characteristic of a damascene process.

Each of the dielectric layers 44, 46, 48 of the interconnect structure 42 may comprise any suitable organic or inorganic dielectric material recognized by a person having ordinary skill in the art as an electrical insulator. Candidate inorganic dielectric materials may include, but are not limited to, silicon dioxide, silicon nitride, fluorine-doped silicon glass (FSG), and combinations of these dielectric materials. Alternatively, one or more of the dielectric layers 44, 46, 48 may be comprised of a dielectric material having a relative permittivity or dielectric constant smaller than the dielectric constant of silicon dioxide (i.e., 3.9), such as hydrogen-enriched silicon oxycarbide (SiCOH). The dielectric layers 44, 46, 48 may be deposited by chemical vapor deposition, plasma enhanced chemical vapor deposition (PECVD), spin coat and cure, etc.

The wires 50, 51, 52, 54, heat shield 56, and plugs 58, 59, 60 of the interconnect structure 42 may be comprised of copper (Cu), aluminum (Al), tungsten (W), metal silicides, etc. These types of metals may be deposited by, for example, chemical vapor deposition or by an electrochemical process such as electroplating or electroless plating. In one embodiment, the wires 50, 51, 52, 54 and heat shield 56 are comprised of copper, and the plugs 58, 59, 60 are comprised of tungsten. The metals comprising the wires 50, 51, 52, 54, heat shield 56, and plugs 58, 59, 60 have a high thermal conductivity, in addition to a high electrical conductivity, in comparison with, for example, the dielectric materials comprising the dielectric layers 44, 46, 48. A titanium-based or tungsten-based liner layer may be applied to the trenches and vias in order to mitigate future diffusion of the constituent conductor of the wires 50, 51, 52, 54, heat shield 56, and plugs 58, 59, 60 into the surrounding dielectric materials comprising the dielectric layers 44, 46, 48.

Wire 54 is located in a different plane than wires 50, 52 and the heat shield 56. Wire 54 is also located in a different plane than the device structure 40, but laterally overlaps in location with the location of the device structure 40. The heat shield 56 is positioned vertically between the device structure 40 and the wire 54.

When powered, the device structure 40 receives an electrical current that causes the device structure 40 to generate heat due to Joule heating. The device structure 40 is surrounded by the trench isolation regions 22 and buried insulator layer 16, which are comprised of materials characterized by low thermal conductivity. As a result of the thermal isolation by the trench isolation regions 22 and buried insulator layer 16, the heat energy generated by the device structure 40 conducts vertically through the interconnect structure 42 and its metal features (e.g., wires 50, 51, 52, 54).

The heat shield 56 operates as a heat sink so that the heating of the overlying wire 54 is reduced. Heat energy is conducted from the heat shield 56 to the handle wafer 18 in a heat transfer path 57 that includes the wire 51, the via plug 59, the contact plug 38, and the doped region 32. The heat energy is dissipated in the handle wafer 18 so that the temperature of the heat shield 56 is limited. The contact plug 38 is in good thermal contact with the handle wafer 18 for the exchange of heat energy and, in addition, the temperature of the handle wafer 18 is less than the temperature of the heat shield 56 so that heat energy flows from the heat shield 56 to the handle wafer 18. The presence of the doped region 32 in the epitaxial layer 20 at the base of the trench 26 does not significantly alter the heat transfer to the handle wafer 18. By limiting the temperature rise of the wire 54 through the use of the heat shield 56, the reliability of the wire 54 may be improved as its susceptibility to degradation from electromigration may be reduced. The heat shield 56 may also eliminate the occurrence of a hot spot in the temperature profile across the chip, which may be used as a functionality metric.

The doped region 32 functions as an isolation structure that disrupts the electrical connection of the contact plug 38 with the handle wafer 18. Specifically, the doped region 32 defines a junction 33 with the adjacent portion of the epitaxial layer 20 of opposite conductivity type and, as a consequence, forms a junction capacitor. When the device structure 40 and wires 50, 52, 54 are powered and the epitaxial layer 22 is biased, the junction 33 between the doped region 32 and adjacent epitaxial layer 22 is reversed biased to provide a capacitance that is coupled in series with the parasitic capacitance contributed by the heat shield 56. The series connection of the parasitic capacitance due to the heat shield 56 and the capacitance due to the doped region 32 results in a total capacitance that is less than either of the individual capacitances. The reduction in total capacitance operates to improve device performance and/or circuit performance, and may increase the flexibility for using the heat shield 56 in a circuit design to reduce the parasitic capacitance from the heat shield 56 with any penalty as far as heat conduction. The doped region 32 has a negligible effect on the ability to transfer heat energy from the contact plug 38 to the handle wafer 18 for dissipation in the handle wafer 18. In other words, the doped region 32 does not otherwise improve thermal resistance. As a result, the electrical connection may be interrupted by the doped region 32 without sacrificing the heat transfer efficiency.

The contact plug 36, which lacks a doped region equivalent to doped region 32, provides a low-resistance contact of the device layer 12 with the handle wafer 18. The contact plug 36 may be used to bias the epitaxial layer 20 from the device side of the SOI substrate 10.

Figure 2:
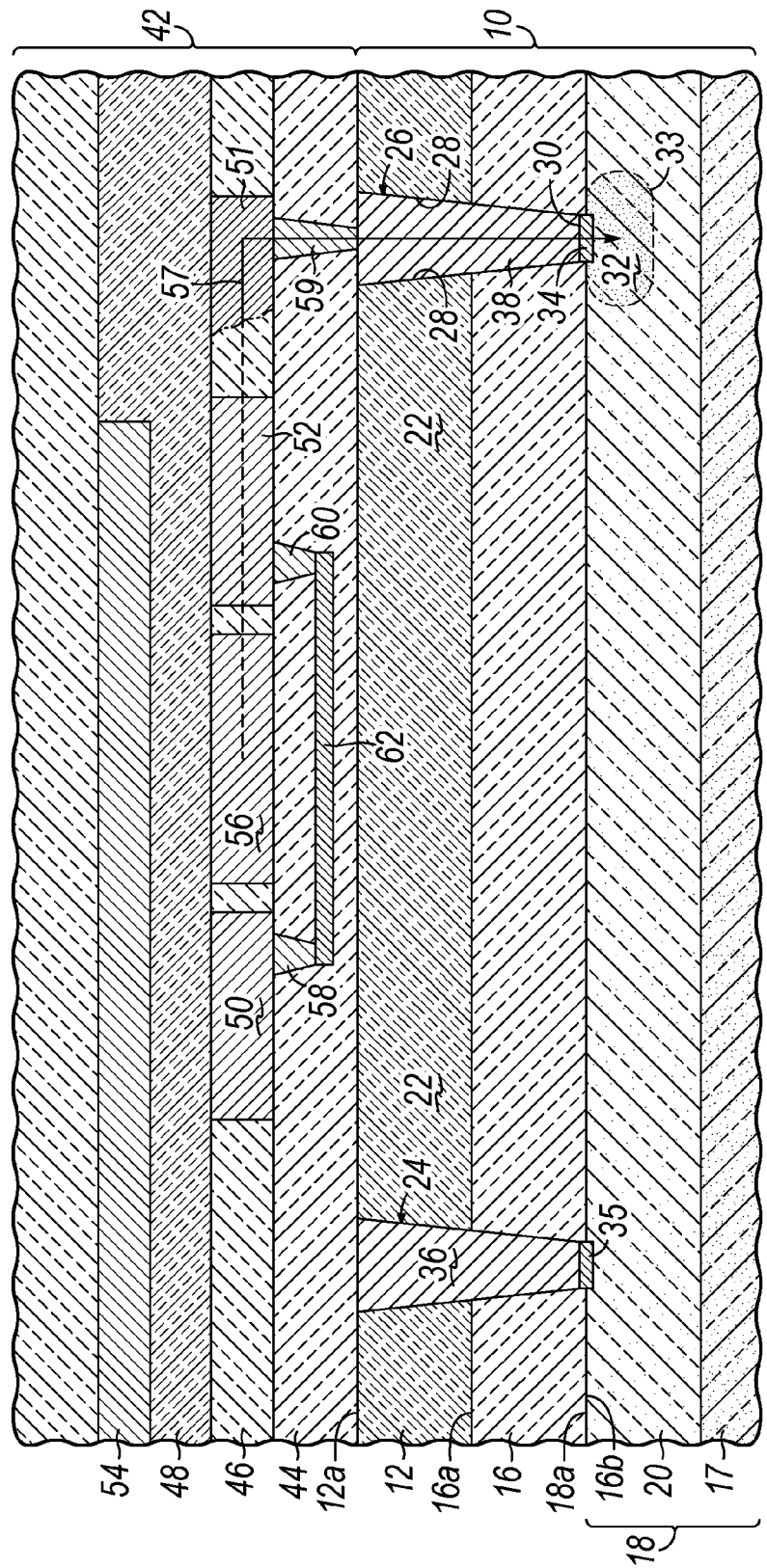
FIG. 2 is a cross-sectional view of a portion of a substrate including a device structure in accordance with an alternative embodiment of the invention.

With reference to FIG. 2 in which like reference numerals refer to like features in FIG. 1 and in accordance with an alternative embodiment of the invention, a device structure 62 operating as the heat generator may be located interconnect structure 42 instead of being located at the underlying level that includes the device layer 12 and trench isolation regions 22. The device structure 62 may be a passive device, such as a resistor, formed in the interconnect structure 42 by layer deposition and patterning. The heat shield 56 absorbs heat energy emanating from the device structure 62. The absorbed heat is conducted from the heat shield 56 through portion of the heat transfer path 57 defined by the wire 51 and via plug 59 to the contact plug 38 and subsequently from the contact plug 38 through the doped region 32 into the handle wafer 18 for dissipation in the handle wafer 18.

Figure 3:
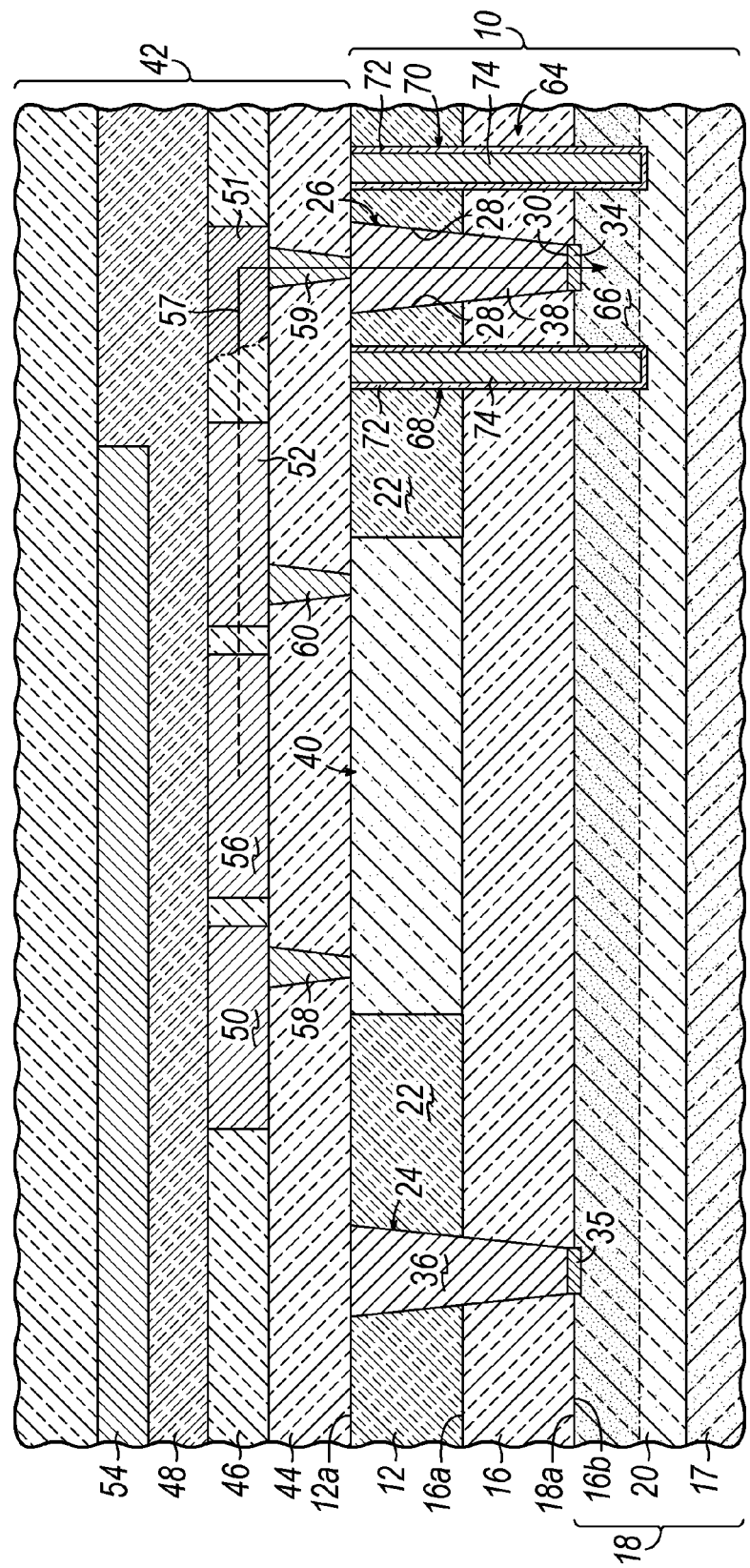
FIG. 3 is a cross-sectional view of a portion of a substrate including a device structure in accordance with an alternative embodiment of the invention.

With reference to FIG. 3 in which like reference numerals refer to like features in FIG. 1 and in accordance with an alternative embodiment of the invention, a deep trench moat, generally indicated by reference numeral 64, may be used to surround a portion 66 of the epitaxial layer 20 and thereby electrically isolate the semiconductor material of the portion 66 from the remainder of the epitaxial layer 20. The deep trench moat 64 and the portion 66 of the epitaxial layer 20 collectively provide an isolation structure. The portion 66 of the epitaxial layer 20 is located into the flow path 57 for heat transfer from the heat shield 56 to the handle wafer 20. The deep trench moat 64 includes a plurality of trenches 68, 70 that extend from the top surface 10a of the device layer through the trench isolation regions 22, through the buried insulator layer 16, and completely through the epitaxial layer 20 into the bulk wafer 17 of the handle wafer 18. The deep trench moat 64 also surrounds the trench 26 in which the contact plug 38 is formed.

Each of the trenches 68, 70 may be lined with a layer 72 comprised of a dielectric material (e.g., $SiO_2$) and filled with a core 74 comprised of semiconductor material (e.g., poly-silicon). The dielectric material in the layer 72 provides lateral electrical isolation of the portion 66 of the epitaxial layer 20. The shallow penetration of the trenches 68, 70 into the bulk wafer 17 assists in providing the electrical isolation of the portion 66 of the epitaxial layer 20.

The isolated portion 66 of the epitaxial layer 20 is comprised of semiconductor material having an opposite conductivity type from the semiconductor material constituting the bulk wafer 17 of the handle wafer 18. The portion 66 of the epitaxial layer 20 is electrically floating during chip operation. The series connection of the parasitic capacitance due to the heat shield 56 and the capacitance due to the portion 66 of the epitaxial layer 20 results in a total capacitance that is less than either of the individual capacitances.

The heat shield 56 absorbs heat from the device structure 62 and transfers the absorbed heat in a path 57 through the wire 51 and via plug 59 to the contact plug 38 and from the contact plug 38 through the portion 66 of the epitaxial layer 20 to the handle wafer 18 for dissipation in the handle wafer 18. The deep trench moat 64 and the portion 66 of the epitaxial layer 20 may have a negligible impact on heat transfer while providing the series capacitance that reduces the overall capacitance.

Figure 4:
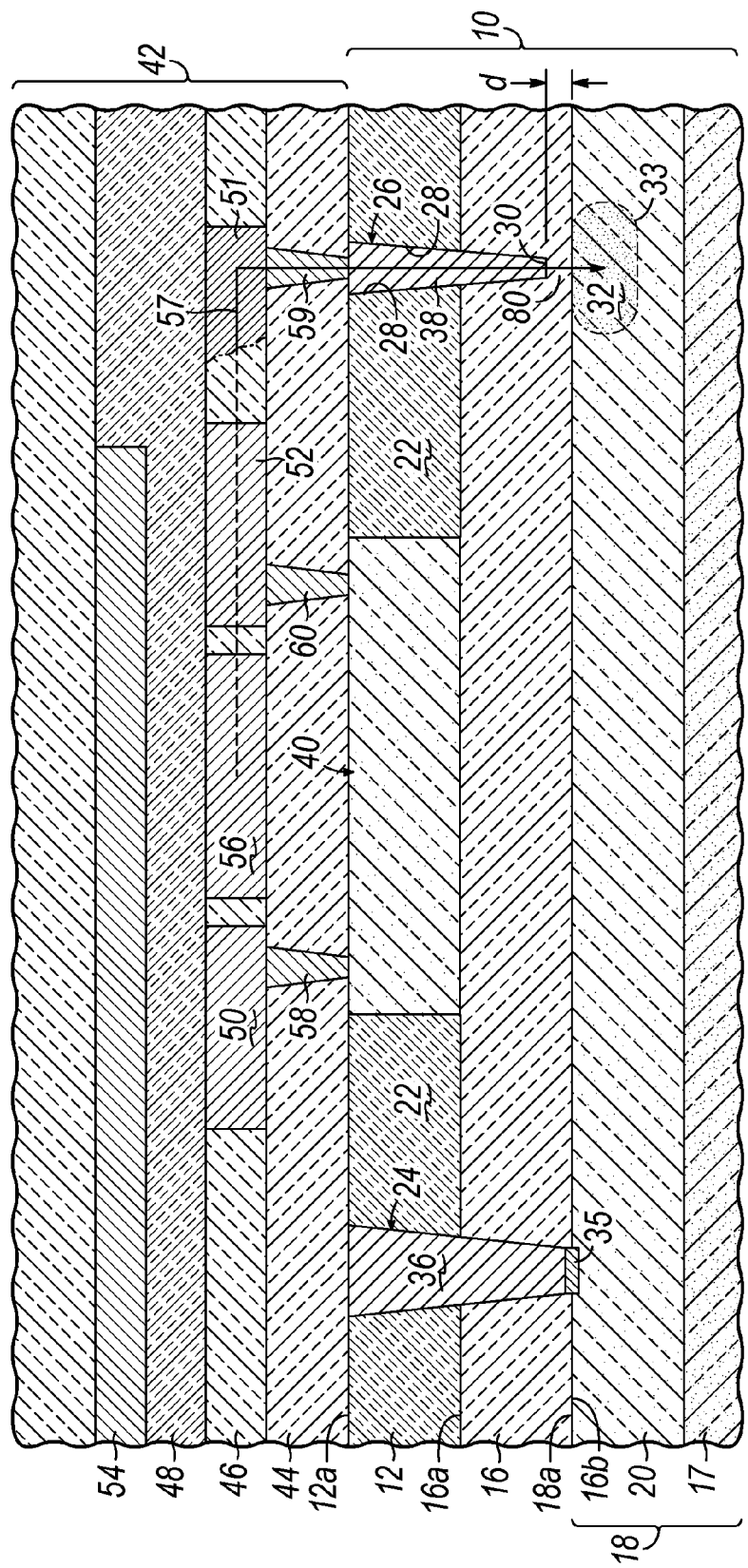
FIG. 4 is a cross-sectional view of a portion of a substrate including a device structure in accordance with an alternative embodiment of the invention.

With reference to FIG. 4 in which like reference numerals refer to like features in FIG. 1 and in accordance with an alternative embodiment of the invention, a portion 80 of the buried insulator layer 16 may function as an isolation structure. In this embodiment, the trench 26 is formed with a smaller critical dimension so that trench 26 etches at a slower rate than trench 24. The result of the differential rates at which the trenches 24, 26 are formed is that the bottom surface 30 of the trench 26 is separated by a distance, d, from the top surface 18a of the handle wafer 18, and the resulting portion 80 of the buried insulator layer 16 separates the contact plug 38 from the handle wafer 18. The heat shield 56 absorbs heat from the device structure 62 and transfers the absorbed heat in a path through the wire 51 and via plug 59 to the contact plug 38 and from the contact plug 38 through the portion 80 of the buried insulator layer 16 to the handle wafer 18 for dissipation in the handle wafer 18.

The portion 80 of the buried insulator layer 16 residing in the gap between the contact plug 38 and the handle wafer 18 creates a capacitance that is coupled in series with the parasitic capacitance contributed by the heat shield 56, which reduces the overall total capacitance and breaks the electrical connection. The series connection of the parasitic capacitance due to the heat shield 56 and the capacitance due to the portion 80 of the buried insulator layer 16 results in a total capacitance that is less than either of the individual capacitances. The portion 80 of the buried insulator layer 16 may have a minimal impact on thermal conduction in connection with heat transfer. Further, no additional masks are required to form the portion 80 of the buried insulator layer 16.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure formed using a silicon-on-insulator substrate that includes a device layer, a buried insulator layer, and a handle wafer, the structure comprising:
   a trench isolation region in the device layer;
   a contact plug in a trench extending through the trench isolation region and at least only partially through the buried insulator layer;
   an interconnect structure including a heat shield and a first wire coupling the heat shield with the contact plug; and
   an isolation structure between the contact plug and a portion of the handle wafer,
   wherein the isolation structure capacitively isolates the heat shield from the handle wafer, and the isolation structure comprises a portion of the buried insulator layer between the contact plug and the handle wafer.

2. The structure of claim 1 wherein the isolation structure comprises a junction capacitor.

3. The structure of claim 1 wherein the isolation structure provides a first capacitance and the heat shield provides a second capacitance coupled by the first wire with the isolation structure in order to reduce the second capacitance of the heat shield.

4. The structure of claim 1 wherein the interconnect structure includes a second wire and the device layer includes a device structure capable of generating heat when powered, and the heat shield is located between the device structure and the second wire.

5. The structure of claim 1 wherein the heat shield is formed in a first metallization level of the interconnect structure, and the device structure is a passive device located in a second level of the interconnect structure between the first metallization level and the device layer.

6. A structure formed using a silicon-on-insulator substrate that includes a device layer, a buried insulator layer, and a handle wafer, the structure comprising:
   a trench isolation region in the device layer;
   a contact plug in a trench extending through the trench isolation region and through the buried insulator layer to the handle wafer;
   an interconnect structure including a heat shield and a first wire coupling the heat shield with the contact plug; and
   an isolation structure between the contact plug and a portion of the handle wafer, wherein the isolation structure capacitively isolates the heat shield from the handle wafer, the isolation structure comprises a doped region in a portion of the handle wafer adjacent to a bottom surface of the trench, the doped region has a first conductivity type, and the portion of the handle wafer has a second conductivity type opposite from the first conductivity type.

7. The structure of claim 6 wherein the isolation structure comprises a junction capacitor.

8. The structure of claim 6 wherein the isolation structure provides a first capacitance and the heat shield provides a second capacitance coupled by the first wire with the isolation structure in order to reduce the second capacitance of the heat shield.

9. The structure of claim 6 wherein the interconnect structure includes a second wire and the device layer includes a device structure capable of generating heat when powered, and the heat shield is located between the device structure and the second wire.

10. The structure of claim 6 wherein the heat shield is formed in a first metallization level of the interconnect structure, and the device structure is a passive device located in a second level of the interconnect structure between the first metallization level and the device layer.

11. A structure formed using a silicon-on-insulator substrate that includes a device layer, a buried insulator layer, and a handle wafer, the structure comprising:
   a trench isolation region in the device layer;
   a contact plug in a trench extending through the trench isolation region and at least partially through the buried insulator layer;
   an interconnect structure including a heat shield and a first wire coupling the heat shield with the contact plug; and
   an isolation structure between the contact plug and a portion of the handle wafer,
   wherein the isolation structure capacitively isolates the heat shield from the handle wafer, the handle wafer includes a bulk wafer and an epitaxial layer of opposite conductivity type from the bulk wafer, and the isolation structure includes a deep trench moat that extends through the trench isolation region in the device layer, through the buried insulator layer, and through the epitaxial layer into the bulk wafer, and the isolation structure comprises a portion of the epitaxial layer surrounded by the deep trench moat.

12. The structure of claim 11 wherein the isolation structure comprises a deep trench moat capacitor.

13. The structure of claim 11 wherein the isolation structure provides a first capacitance and the heat shield provides a second capacitance coupled by the first wire with the isolation structure in order to reduce the second capacitance of the heat shield.

14. The structure of claim 11 wherein the interconnect structure includes a second wire and the device layer includes a device structure capable of generating heat when powered, and the heat shield is located between the device structure and the second wire.

15. The structure of claim 11 wherein the heat shield is formed in a first metallization level of the interconnect structure, and the device structure is a passive device located in a second level of the interconnect structure between the first metallization level and the device layer.

* * * * *

UNITED STATES PATENT AND TRADEMARK OFFICE
CERTIFICATE OF CORRECTION

PATENT NO. : 9,530,798 B1  
APPLICATION NO. : 14/748355  
DATED : December 27, 2016  
INVENTOR(S) : Anthony I. Chou et al.

Page 1 of 1

It is certified that error appears in the above-identified patent and that said Letters Patent is hereby corrected as shown below:

In the Claims

At Column 8, Claim number 1, Line number 30, after "and" delete "at least"

Signed and Sealed this
Fourteenth Day of February, 2017

Michelle K. Lee
*Director of the United States Patent and Trademark Office*